(12) United States Patent
Gadat et al.

(10) Patent No.: US 10,554,291 B2
(45) Date of Patent: Feb. 4, 2020

(54) METHOD AND SYSTEM FOR DETECTING USEFUL SIGNALS WITH SIGNIFICANT RESPECTIVE FREQUENCY DRIFTS IN AN OVERALL SIGNAL

(71) Applicant: AIRBUS DEFENCE AND SPACE SAS, Toulouse (FR)

(72) Inventors: Benjamin Gadat, Toulouse (FR); Lyonel Barthe, Toulouse (FR); Thibault Maisonnat, Toulouse (FR); Arnaud Collin, Toulouse (FR)

(73) Assignee: AIRBUS DEFENCE AND SPACE SAS, Toulouse (FR)

( * ) Notice: Subject to any disclaimer, the term of this patent is extended or adjusted under 35 U.S.C. 154(b) by 0 days.

(21) Appl. No.: 16/323,750

(22) PCT Filed: Jul. 27, 2017

(86) PCT No.: PCT/FR2017/052110
§ 371 (c)(1),
(2) Date: Feb. 6, 2019

(87) PCT Pub. No.: WO2018/024968
PCT Pub. Date: Feb. 8, 2018

(65) Prior Publication Data
US 2019/0341996 A1  Nov. 7, 2019

(30) Foreign Application Priority Data

Aug. 5, 2016 (FR) ...................................... 16 57616

(51) Int. Cl.
*H04B 7/185* (2006.01)
*H04L 27/00* (2006.01)
(Continued)

(52) U.S. Cl.
CPC ............. *H04B 7/185* (2013.01); *H04B 17/21* (2015.01); *H04L 25/0222* (2013.01); *H04L 27/0014* (2013.01); *H04L 2027/0024* (2013.01)

(58) Field of Classification Search
CPC combination set(s) only.
See application file for complete search history.

(56) References Cited

U.S. PATENT DOCUMENTS 5,774,829 A *  6/1998  Cisneros ................. G01S 5/145
                                                  342/457
5,933,792 A *  8/1999  Andersen .................. G01J 3/28
                                                  702/32
(Continued)

FOREIGN PATENT DOCUMENTS

FR        2 992 506 A1    12/2013
FR        2 995 115 A1     3/2014
(Continued)

*Primary Examiner* — Yuwen Pan
*Assistant Examiner* — Erica L Fleming-Hall
(74) *Attorney, Agent, or Firm* — Im IP Law; Chai Im; C. Andrew Im (57) ABSTRACT

A method for detecting useful signals in an overall signal. Each useful signal may be affected with a frequency drift. In the detection phase, frequency spectra for detecting the overall signal for multiple detection time windows are calculated and useful signals according to the detection frequency spectra are detected. In the estimation phase, for each useful signal detected: the frequency of the overall signal for multiple frequency drift values is reset. In the estimation phase, for each useful signal detected, a frequency spectrum is calculated for the estimation of the overall signal for each frequency drift value over an estimation time window having the useful signal detected and of a duration higher than the detection time window. In the estimation phase, for each useful signal detected, the fre-
(Continued)

quency drift is estimated affecting the useful signal detected according to the estimation frequency spectra.

17 Claims, 5 Drawing Sheets

(51) Int. Cl.
*H04L 25/02* (2006.01)
*H04B 17/21* (2015.01)

(56) References Cited

U.S. PATENT DOCUMENTS

| | | | | |
|---|---|---|---|---|
| 6,278,686 | B1* | 8/2001 | Alard | H04L 27/0004 370/204 |
| 6,584,068 | B1* | 6/2003 | Alard | H04L 27/2602 370/208 |
| 7,787,846 | B1* | 8/2010 | Page | H04B 1/40 455/230 |
| 8,406,353 | B1 | 3/2013 | Na et al. | |
| 2001/0014115 | A1* | 8/2001 | Kumura | H04B 1/7075 375/148 |
| 2002/0110184 | A1* | 8/2002 | Akopian | H04B 1/7075 375/149 |
| 2004/0180697 | A1* | 9/2004 | Lee | G01P 3/50 455/561 |
| 2006/0203889 | A1* | 9/2006 | Page | H04B 1/16 375/130 |
| 2009/0294651 | A1* | 12/2009 | Koster | H01J 49/38 250/282 |
| 2014/0064586 | A1* | 3/2014 | Peacock, III | G01R 33/4625 382/131 |
| 2014/0070989 | A1* | 3/2014 | Wang | G01S 19/21 342/357.59 |
| 2014/0114601 | A1* | 4/2014 | Juhl | G01J 3/28 702/104 |
| 2014/0177681 | A1* | 6/2014 | Chung | H04B 1/7097 375/146 |
| 2014/0219325 | A1 | 8/2014 | Artigue et al. | |
| 2015/0148008 | A1 | 5/2015 | Fourtet et al. | |
| 2015/0155960 | A1* | 6/2015 | Artigue | H04B 7/2621 370/328 |
| 2015/0222325 | A1* | 8/2015 | Sellier | H04Q 9/00 375/133 |
| 2015/0296327 | A1* | 10/2015 | Delaveau | H04L 9/3228 455/41.1 |
| 2018/0120366 | A1 | 5/2018 | Picard et al. | |
| 2019/0268031 | A1* | 8/2019 | de Ruijter | H04B 1/38 |

FOREIGN PATENT DOCUMENTS

| | | |
|---|---|---|
| FR | 3 302 800 A1 | 8/2016 |
| WO | 2013/007613 A1 | 1/2013 |
| WO | 2014/006351 A1 | 1/2014 |

* cited by examiner

METHOD AND SYSTEM FOR DETECTING USEFUL SIGNALS WITH SIGNIFICANT RESPECTIVE FREQUENCY DRIFTS IN AN OVERALL SIGNAL

RELATED APPLICATIONS

This application is a § 371 application from PCT/FR2017/052110 filed Jul. 27, 2017, which claims priority from French Patent Application No. 16 57616 filed Aug. 5, 2016, each of which is herein incorporated by reference in its entirety.

TECHNICAL FIELD

The present invention relates to the field of the detection of useful signals emitted by different terminals. More particularly, the present invention relates to the detection of useful signals in the case that each useful signal can be affected by a significant frequency drift, for example greater than a spectral bandwidth of said useful signal.

The "spectral bandwidth" of the useful signal is understood to be the bandwidth of the instantaneous frequency spectrum of the useful signal. The spectral bandwidth of said useful signal is thus independent of the frequency drift.

BACKGROUND OF THE INVENTION

The present invention has a particularly advantageous, yet non-limiting application, in the case of so-called "narrowband" useful signals for which the spectral bandwidth is typically less than 2 kilohertz, or even less than 1 kilohertz.

In the case of useful narrowband signals, numerous phenomena can cause a frequency drift that is greater than the spectral bandwidth of said useful signals.

Firstly, since the useful signals are received by a receiving station, relative movements of the terminals in relation to said receiving station can result, by Doppler effect, in frequency drifts which can be significant with regard to the spectral bandwidth of the useful signals if the relative travelling speeds are high. Such frequency drifts can be caused by mobility of the terminals and/or mobility of the receiving station.

In particular, in the case of a receiving station on board a satellite in moving orbit, for example a LEO low earth orbit, the speed of travel of said satellite relative to the terminals (fixed or mobile) can result in significant frequency drifts affecting the useful signals received by said receiving station.

The frequency drift can also be caused during emission in an uncontrolled manner. More specifically, the emission of a useful signal requires a terminal equipped with frequency synthesis means (local oscillator, mixer, etc.) implemented for the frequency translation of the useful signal, generated as a baseband signal, to a frequency band for multiplexing the useful signals. Such frequency synthesis means create a frequency drift which, in particular in the case of useful narrowband signals, can be significant relative to the spectral bandwidth of said useful signals, in particular in the case of low-cost terminals for which the frequency synthesis means are inefficient. However, the frequency drift caused by the frequency synthesis means is low compared to that caused by the relative movements of the terminals with regard to the receiving station, in particular over a short period of time such as the duration of a useful signal.

To a lesser degree, the frequency synthesis means of the receiving station can also create a frequency drift.

The detection of such useful signals is complex, all the more so since the frequency drift can vary from one useful signal to another. Moreover, the initial receiving frequency and the time of receipt of each useful signal are not necessarily known, which makes the detection of the useful signals even more complex, since they must be detected in a blind or near-blind manner a priori without knowing the frequency drifts, the times of receipt and the initial receiving frequencies.

Maximum likelihood estimators can be implemented, which test all possible possibilities. However, the quantity of calculations to be carried out and the quantity of data to be stored in memory is in this case very high, and can be prohibitive, in particular for the detection of useful signals at a satellite.

OBJECT AND SUMMARY OF THE INVENTION

The purpose of the present invention is to overcome all or part of the limitations of the solutions of the prior art, in particular those described hereinabove, by proposing a solution that allows useful signals to be detected in an overall signal, said useful signals being capable of being affected by frequency drifts of different respective values.

For this purpose and according to a first aspect, the invention relates to a method for detecting useful signals in an overall signal, said useful signals being emitted by different terminals in a multiplexing frequency band, each of which useful signals can be affected by a frequency drift, the overall signal corresponding to the radio-frequency signals received in the multiplexing frequency band. The method for detecting useful signals comprises a detection phase followed by an estimation phase. The detection phase comprises:

for a plurality of positions of a detection time window relative to the overall signal: calculating a detection frequency spectrum of the overall signal for each detection time window being considered, detecting useful signals in the overall signal as a function of the detection frequency spectra.

The estimation phase then comprises, for each useful signal detected in the overall signal:

for a plurality of frequency drift values: readjusting the frequency of the overall signal as a function of the frequency drift value being considered, calculating an estimation frequency spectrum of the overall signal for each frequency drift value over an estimation time window comprising at least part of said useful signal detected, and of a duration that is longer than that of the detection time window, estimating the frequency drift affecting said useful signal detected as a function of the estimation frequency spectra.

Thus, the detection method mainly comprises two phases: a detection phase and an estimation phase. The purpose of the detection phase is to detect the useful signals present in the overall signal, in addition to the respective time positions thereof in said overall signal. Once the useful signals have been detected, the estimation phase then aims, in particular, to estimate the frequency drifts affecting said useful signals detected.

The detection phase and the estimation phase are both based on the calculation of a plurality of frequency spectra of the overall signal.

During the detection phase, several detection frequency spectra of the overall signal are calculated over respective detection time windows that are offset in time relative to one another, in order to determine the respective time positions of the useful signals in the overall signal.

During the estimation phase, several estimation frequency spectra of the overall signal are calculated, for each useful signal detected, and which are respectively associated with different frequency drift values with which the frequency of said overall signal is readjusted. Conversely, for each useful signal detected, the estimation frequency spectra are calculated based on the same estimation time window, positioned relative to the overall signal at the level of said useful signal detected.

The duration of the detection time window is chosen such that it is shorter, or even much shorter than the estimation time window. Such provisions are advantageous for several reasons.

Firstly, given that the purpose of the detection phase is to detect the useful signals and the time positions thereof, and not to estimate the frequency drifts thereof, the duration of the detection time window can be chosen such that the frequency variation created by the frequency drift during the detection time window is not significant, which simplifies the detection of the useful signals. Moreover, the amount of calculations required to obtain the detection frequency spectra decreases with the duration of the detection time window. The frequency resolution of the detection frequency spectra also decreases with said duration, however the frequency resolution needs during the detection phase are limited, insofar as this is primarily aimed at detecting the useful signals and the time positions thereof in the overall signal.

During the estimation phase, an estimation time window having a duration that is longer than that of the detection time window is therefore considered, such that the frequency variation, created by the frequency drift during an estimation time window, is significant and thus allows said frequency drift to be observed and estimated. The quantity of calculations required to obtain an estimation frequency spectrum is greater than that required to obtain a detection frequency spectrum. However, given that the useful signals and the time positions thereof have already been detected during the detection phase, the number of estimation frequency spectra to be calculated is advantageously reduced to the strict minimum required in order to estimate the frequency drift of each useful signal detected. Moreover, by considering an estimation time window of a longer duration, the frequency resolution is improved, which allows the frequency drift of each useful signal to be estimated with a high level of accuracy.

According to specific embodiments, the detection method can further comprise one or more of the following features, which must be considered singly or according to any combinations technically possible.

In specific embodiments, each useful signal comprises a detection pattern and:
  the calculation of the detection frequency spectrum comprises, for each detection time window, a combination of the overall signal and a reference detection pattern positioned at the level of the detection time window considered,
  the calculation of the estimation frequency spectrum comprises, for each frequency drift value, a combination of the overall signal and the reference detection pattern positioned at the level of the estimation time window.

In specific embodiments, the combination of the overall signal and the reference detection pattern comprises a correlation of said overall signal with said reference detection pattern.

In specific embodiments, the duration of the detection time window is shorter than the duration of the detection pattern.

In specific embodiments, the detection method comprises:
  during the detection phase: estimating a receiving frequency for each useful signal detected in the multiplexing band, as a function of the detection frequency spectra,
  during the estimation phase, for each useful signal detected: readjusting the frequency of the overall signal as a function of the estimated receiving frequency for said useful signal detected.

In specific embodiments, the detection method comprises, during the estimation phase, estimating a receiving frequency for each useful signal detected in the multiplexing band, as a function of the estimation frequency spectra.

In specific embodiments, the detection of useful signals comprises searching for local maxima in the detection frequency spectra, whereby a useful signal is considered to have been detected for a local maximum if said local maximum satisfies a predetermined detection criterion.

In specific embodiments, the estimation of the frequency drift affecting one of the useful signals detected comprises searching for an overall maximum in the estimated frequency spectra calculated for said useful signal detected.

In specific embodiments, during the estimation of the frequency drift, the overall maximum is sought from among the values of the estimation frequency spectra obtained in a frequency band of a predetermined bandwidth about a theoretical receiving frequency for the considered useful signal detected.

In specific embodiments, the detection method comprises estimating the number of useful signals to be detected in the overall signal, and the detection of useful signals is carried out as a function of said estimated number of useful signals to be detected.

In specific embodiments, the detection method comprises estimating a range of possible values for the frequency drift, whereby the frequency drift values considered during the estimation phase lie in said range of possible values.

According to a second aspect, the present invention relates to a computer program product comprising a set of program code instructions which, when executed by a processor, configure said processor to implement a method for detecting useful signals in an overall signal according to any of the embodiments of the invention.

According to a third aspect, the present invention relates to a module for detecting useful signals in an overall signal comprising means configured to implement a method according to any of the embodiments of the invention.

According to specific embodiments, the detection module can further comprise one or more of the following features, which must be considered singly or according to any combinations technically possible.

In specific embodiments, the detection module comprises a pipeline-type processing architecture.

In specific embodiments, the detection module comprises a first set of arithmetic units used solely for the detection phase and a second set of arithmetic units used solely for the estimation phase.

According to a fourth aspect, the present invention relates to a system for detecting useful signals in an overall signal, comprising an antenna for receiving the overall signal on board a spacecraft or aircraft, and further comprising a detection module according to any of the embodiments of the invention.

In specific embodiments of the detection system, the detection module is on board the spacecraft or aircraft.

BRIEF DESCRIPTION OF THE DRAWINGS

The invention will be better understood after reading the following description, intended for purposes of illustration only and not intended to limit the scope of the invention, with reference to the following figures which represent.

In these figures, identical reference numerals in one or another figure denote identical or similar elements. For clarity purposes, the elements shown are not to scale, unless specified otherwise.

DETAILED DESCRIPTION OF THE EMBODIMENTS

Figure 1:
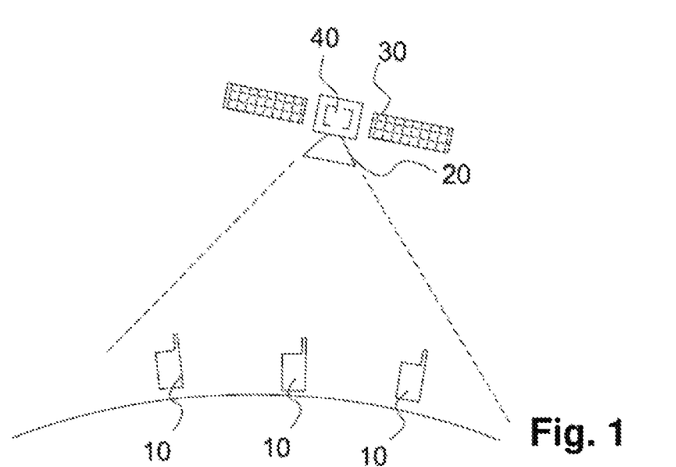
FIG. 1: a diagrammatic view of one example embodiment of a system for detecting useful signals.

FIG. 1 diagrammatically shows one example embodiment of a system for detecting useful signals. The useful signals correspond to radio-frequency signals emitted in a multiplexing frequency band by terminals 10 substantially on the Earth's surface. The term "substantially on the Earth's surface" is understood as meaning that each terminal 10 is located on the ground (on land or at sea) or at an altitude within the Earth's atmosphere (on board an airplane, drone, balloon, etc.).

More particularly, the useful signals must be detected in an overall signal, received by a receiving station 20, representative of all of the radio-frequency signals measured in the multiplexing frequency band. It should be noted that the invention is applicable in any frequency band, in particular in the frequency bands conventionally used in land- or satellite-based telecommunications systems.

In the description hereafter, and as shown in FIG. 1, the case considered, in a non-limiting manner, is that in which the receiving station 20 is on board a satellite 30 orbiting the Earth. However, this in no way excludes other examples, such as having a receiving station on board a spacecraft or aircraft (airplane, drone, balloon, etc.). The receiving station can also, in other examples, be on the ground (on land or at sea).

The satellite 30 is preferably in low Earth orbit (LEO). However, this in no way excludes other types of orbit, for example a medium Earth orbit (MEO) or a geostationary orbit (GEO), etc.

Each terminal 10 can be stationary or moving. Similarly, the receiving station 20 can be stationary or moving.

As stated above, each useful signal received by the receiving station 20 can be affected by a frequency drift. In the description hereafter, the case considered, in a non-limiting manner, is that in which the frequency drift exceeds the spectral bandwidth of said useful signal. The term "spectral bandwidth" is understood to be the bandwidth of the instantaneous frequency spectrum of the useful signal.

The multiplexing frequency band preferably has a bandwidth that is far greater than the spectral bandwidth of each useful signal, for example at least 100 times greater than the maximum spectral bandwidth of the useful signals. The overall signal, representative of the radio signals measured in the multiplexing frequency band, can therefore comprise numerous frequency-multiplexed signals in said multiplexing frequency band. Moreover, given that the useful signals are of finite duration, the overall signal can further comprise numerous useful signals distributed over time. In the description hereafter, the case considered, in a non-limiting manner, is that in which the receiving station 20 a priori does not know:

the respective times of receipt of the useful signals, for example because the terminals can emit at any chosen time, without prior authorization, or can emit at randomly selected times in order to reduce the risks of collision between useful signals, etc., the initial respective receiving frequencies of said useful signals, for example because the terminals can emit over any chosen frequency within the multiplexing frequency band, or because they do not have full control over the frequency over which they emit (for example as a result of inefficient frequency synthesis means), etc.

In the description hereafter, the case considered, in a non-limiting manner, is that in which the useful signals are narrowband signals, that is to say that they have a spectral bandwidth of less than or equal to 2 kilohertz, preferably of less than or equal to 1 kilohertz. The invention moreover applies for other types of useful signal, however it is understood that, for such useful signals, a frequency drift can easily become significant.

As shown in FIG. 1, the system for detecting useful signals further comprises a detection module 40.

In the non-limiting example shown in FIG. 1, the detection module 40 is on board the satellite 30. Nothing prevents, in other examples, having a detection module 40 that is remote from the satellite 30, for example at a ground station (not shown in the figures), or distributed between the satellite 30 and one or more remote pieces of equipment of said satellite 30. For redundancy purposes, the detection system can comprise a detection module 40 on board the satellite 30, and another detection module 40 at one or more ground stations.

The detection module 40 is in particular suitable for detecting useful signals in the overall signal received by the receiving station 20, said overall signal taking on the form of a sequence of samples obtained after the analogue-to-digital conversion of an analogue signal provided by said receiving station 20.

The detection module 40 comprises, for example, a processing circuit comprising one or more processors and storage means (magnetic hard drive, electronic memory, optical disc, etc.) in which a computer program product is stored, in the form of a set of program code instructions to be executed in order to implement all or part of the steps of a method 50 for detecting useful signals in the overall signal. Alternatively, or additionally, the processing circuit comprises one or more programmable logic devices (FPGA, PLD, etc.), and/or one or more application-specific integrated circuits (ASIC), and/or a set of discrete electronic components, etc., suitable for implementing all or part of the steps of the method 50 for detecting useful signals.

In other words, the processing circuit corresponds to a set of means configured by software (specific computer program product) and/or hardware (FPGA, PLD, ASIC, etc.) to implement the different steps of the method 50 for detecting useful signals.

The detection method 50 according to the invention is particularly effective for implementation in ASIC or FPGA technology taking advantage of the hardware parallelism and thus reducing the complexity, cost and overall dimensions of the hardware solution.

More specifically, the overall structure of the detection method 50 allows a pipeline processing architecture to be installed, which carries out the different steps of the detection method 50 in parallel, while favoring the reuse of hardware resources. Such a pipeline processing architecture is significantly more advantageous than a sequential processing architecture, which would produce a less optimized solution as it uses the available hardware resources less effectively.

Figure 2:
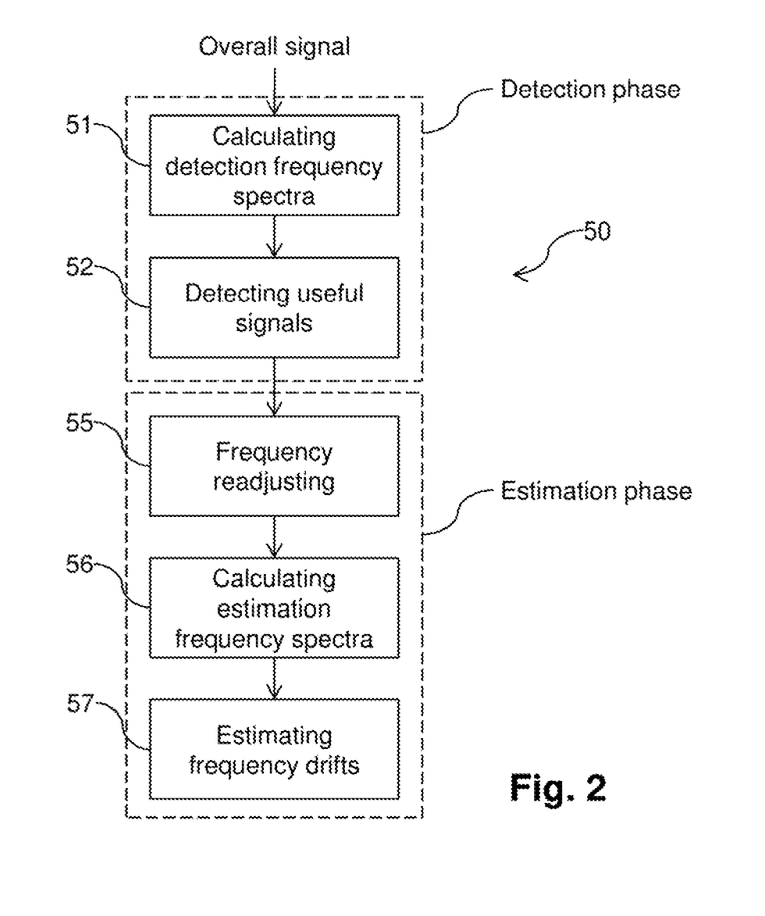
FIG. 2: a diagram showing the main steps of a method for detecting useful signals according to the invention.

FIG. 2 shows the main steps of a method 50 for detecting useful signals in the overall signal. As shown in FIG. 2, the detection method 50 mainly comprises two phases:
- a detection phase, the purpose whereof is to detect the useful signals in the overall signal, as well as the time positions thereof in said overall signal,
- an estimation phase, the purpose whereof is to estimate the respective frequency drifts of the useful signals detected during the detection phase.

The detection phase is thus carried out before the estimation phase, given that the estimation phase is based on the useful signals detected during the detection phase. Preferably, the estimation phase is thus carried out after the detection phase is complete. However, this does not prevent the estimation phase from being carried out before the detection phase is complete. More specifically, the estimation phase can be carried out as soon as a useful signal has been detected during the detection phase, in order to estimate the frequency drift thereof, without having to wait for the detection of all useful signals in the overall signal.

As shown in FIG. 2, the detection phase comprises:
- for a plurality of positions of a detection time window relative to the overall signal: a step 51 of calculating a detection frequency spectrum of the overall signal over each detection time window being considered,
- a step 52 of detecting useful signals in the overall signal as a function of the detection frequency spectra.

The estimation phase comprises, for each useful signal detected:
- for a plurality of frequency drift values: a step 55 of readjusting the frequency of the overall signal as a function of the frequency drift value being considered,
- a step 56 of calculating an estimation frequency spectrum of the overall signal for each frequency drift value over an estimation time window comprising at least part of said useful signal detected, and of a duration that is longer than that of the detection time window,
- a step 57 of estimating the frequency drift affecting said useful signal detected as a function of the estimation frequency spectra.

In the description hereafter, the case considered, in a non-limiting manner, is that in which each useful signal to be detected comprises a predetermined detection pattern, a priori known to the detection module 40 or which can be determined thereby before detection. For example, the detection pattern corresponds to information that is a priori known to the detection module 40, placed in the preamble, and/or the midamble, and/or the postamble of said useful signal. In such a case, the detection module 40 can store a reference detection pattern in memory, said pattern corresponding to the detection pattern inserted into each useful signal by each terminal 10, and can take advantage of the presence of said detection pattern in each useful signal in order to improve detection. For example, in preferred embodiments of the detection method 50:
- the step 51 of calculating a detection frequency spectrum comprises, for each detection time window, a combination of the overall signal and all or part of said reference detection pattern positioned at the detection time window being considered, and
- the step 56 of calculating an estimation frequency spectrum comprises, for each frequency drift value, a combination of the overall signal and all or part of said reference detection pattern positioned at the estimation time window.

More specifically, by combining the overall signal and the reference detection pattern, for example by correlating said overall signal with said reference detection pattern, the useful signal-to-noise ratio is improved when the reference detection pattern is substantially superimposed on the detection pattern included in a useful signal, and thus the detection of said useful signal is improved.

However, it should be noted that, according to other examples not described in detail in the description hereafter, the invention can also be implemented in the absence of any detection pattern. In particular, in the case of useful narrowband signals, the instantaneous frequency spectrum of each useful signal is very narrow in frequency and in principle forms a characteristic peak which can be detected by a spectral analysis, a priori without using knowledge of a detection pattern included in the useful signals.

In the case considered hereafter, in which a priori knowledge of a detection pattern included in each useful signal is used, the duration of the detection time window is, for example, shorter than the duration of said detection pattern, or even much shorter than that of said detection pattern (at least by a factor of five), in order to ensure that the frequency variation induced by the frequency drift during said detection time window is not significant.

Example embodiments of the different steps of the detection phase and estimation phase will now be described in detail.

A) Detection Phase

A.1) Calculating a Detection Frequency Spectrum

As mentioned hereinabove, the detection phase comprises, for a plurality of positions of a detection time window relative to the overall signal, a step 51 of calculating a detection frequency spectrum of the overall signal over each detection time window being considered. Moreover, the case considered, in a non-limiting manner, is that in which the overall signal is combined with a reference detection pattern.

The overall signal takes on the form of a sequence of samples obtained after the analogue-to-digital conversion of an analogue signal provided by the receiving station 20. For example, the overall signal comprises a number $N_{ACQ}$ of samples $x[j]$ ($0 \leq j \leq N_{ACQ}-1$) separated by a predefined sampling period Te.

In order to calculate a detection frequency spectrum, only the samples of the overall signal that lie within a detection time window of the predetermined duration OT are taken into account, and detection frequency spectra for different time positions within said detection time window with regard to the overall signal are calculated. In the description hereafter, the case considered is that in which each detection time window comprises $N_{DET}$ samples of the overall signal ($\delta T = N_{DET} \cdot Te$). The number of different time positions considered depends on the desired accuracy of the estimation of the receiving time of a useful signal.

In the description hereafter, the case considered, as a non-limiting example, is that in which the different time positions considered are spaced apart from the sampling period Te. Thus, the detection time window positioned at the level of the time of rank k comprises the $N_{DET}$ samples x[k] to x[k+$N_{DET}$−1], and $x_k$ denotes the vector comprising these $N_{DET}$ samples:

$$x_k = \{x[k+n], 0 \le n \le N_{DET}-1\}$$

In such a case, $N_{FEN}$ different time positions can be considered for the detection time window, where $N_{FEN}$ is equal to ($N_{ACQ} - N_{DET} + 1$).

The reference detection pattern, which corresponds to the detection pattern included in a useful signal, is denoted by $p_{REF}$ and comprises $N_{REF}$ samples $p_{REF}[0]$ to $p_{REF}[N_{REF}-1]$. In the example described hereafter, $N_{REF}$ is taken, in a non-limiting manner, to be greater than the number $N_{DET}$ of samples of the detection time window.

As stated hereinabove, the step 51 of calculating a detection frequency spectrum preferably comprises, for each detection time window, a combination of the overall signal and the reference detection pattern positioned at the level of the detection time window being considered. Given that $N_{REF}$ is greater than $N_{DET}$, only a part of the samples of the reference detection pattern $p_{REF}$, for example formed by the first $N_{DET}$ samples of said reference detection pattern, is combined with the overall signal $x_k$ over the detection time window positioned at the level of the time of rank k. The combination corresponds, for example, to a correlation of the overall signal $x_k$ with the reference detection pattern, in which case the overall signal $x'_k$ obtained after combination corresponds, for example, to the following vector:

$$x'_k = \{x[k+n] \cdot p_{REF}[n]^*, 0 \le n \le N_{DET}-1\}$$

in which expression $z^*$ corresponds to the conjugate of the complex number z.

The detection frequency spectrum of the overall signal $x'_k$ obtained after combination over the detection time window positioned at the level of the time of rank k is denoted as $SD_k$. The detection frequency spectrum $SD_k$ is, for example, calculated by a Fast Fourier Transform (FFT) of the overall signal $x'_k$, in which case:

$$SD_k = FFT(x'_k)$$

It should be noted that the combination can be calculated indifferently either in the time domain or in the frequency domain. In particular, said combination can be carried out in the time domain, before calculating the detection frequency spectrum $SD_k$, or after passing into the frequency domain, by combining the frequency spectrum of the reference detection pattern and the detection frequency spectrum $SD_k$.

Thus, at the end of the calculation step 51, $N_{FEN}$ detection frequency spectra $SD_k$ are, for example, obtained and respectively associated with the $N_{FEN}$ different considered time positions of the detection time window with regard to the overall signal ($0 \le k \le N_{FEN}-1$).

A.2) Detecting Useful Signals

As stated hereinabove, the detection phase further comprises a step 52 of detecting useful signals in the overall signal as a function of the detection frequency spectra $SD_k$ calculated.

In preferred embodiments, the detection step 52 comprises searching for local maxima in the detection frequency spectra $SD_k$. More specifically, the presence of a useful signal in the overall signal generally results in the presence of a peak in the detection frequency spectrum calculated for the detection time window positioned at the level of this useful signal. It is therefore understood that the search for local maxima must allow the useful signals received in the overall signal to be identified. A useful signal is thus considered to have been detected for a local maximum if said local maximum satisfies a predetermined detection criterion. For example, the detection criterion is considered to have been satisfied for a local maximum of a detection frequency spectrum $SD_k$ if said local maximum is greater than a predetermined threshold value and/or if said local maximum is a part of the $N_P$ highest local maxima identified for all of the $N_{FEN}$ detection frequency spectra, where $N_P$ is a predetermined number of useful signals to be detected in the overall signal, etc.

Preferably, the search for local maxima in a detection frequency spectrum $SD_k$ only produces local maxima spaced apart by a frequency front porch having a predetermined frequency bandwidth. Such provisions reduce the probability of false detection. More specifically, two very close local maxima generally correspond to the same useful signal, and the consideration of such a frequency front porch thus prevents the detection of a plurality of useful signals where there is probably only one useful signal. For useful narrow-band signals, the frequency bandwidth of the frequency front porch is, for example, about 50 Hz.

For the same reasons, a maximum number $N_{MAX}$ of local maxima that can be detected in each detection frequency spectrum $SD_k$, can also be considered, where the number $N_{MAX}$ is, where appropriate, less than or equal to $N_P$.

The number $N_P$ of useful signals to be detected in the overall signal is, for example, a predefined number that does not vary over time. According to other examples, the number $N_P$ of useful signals to be detected in the overall signal can vary over time. Where appropriate, the number $N_P$ is, for example, estimated by the detection module 40 by carrying out a statistical analysis of the overall signal, and/or by taking into account a density model of the terminals 10 in the geographic areas covered by the satellite 30, etc. Useful signals detected during previous executions of the detection method 50 can also be taken into account in order to estimate the number $N_P$ of useful signals to be detected. More specifically, the number $N_P$ can initially be intentionally exaggerated in order to reduce the probability of missing a useful signal present in the overall signal. After having detected a useful signal, demodulation steps, which fall outside of the scope of the invention, are generally carried out in order to extract the data included in said useful signal detected. These demodulation steps can thus be used to check whether the signal detected corresponds to a useful signal emitted by a terminal 10. If this is not the case, the number $N_P$ of useful signals to be detected is updated to take into account the signals detected that were ultimately proven not to be useful signals emitted by terminals 10.

At the end of the detection step 52, $N_P$ useful signals were thus detected. For each useful signal detected, the detection frequency spectrum $SD_k$ in which the corresponding local maximum has been detected is further used to estimate the time of receipt of said useful signal. More specifically, the time of receipt $T_m$ ($0 \le m \le N_P-1$) of said useful signal detected can, for example, be estimated to be the time position (time of rank k) of the detection time window associated with the detection frequency spectrum $SD_k$ having led to the detection of this useful signal.

A.3) Estimating the Receiving Frequency of a Useful Signal Detected

Figure 3:
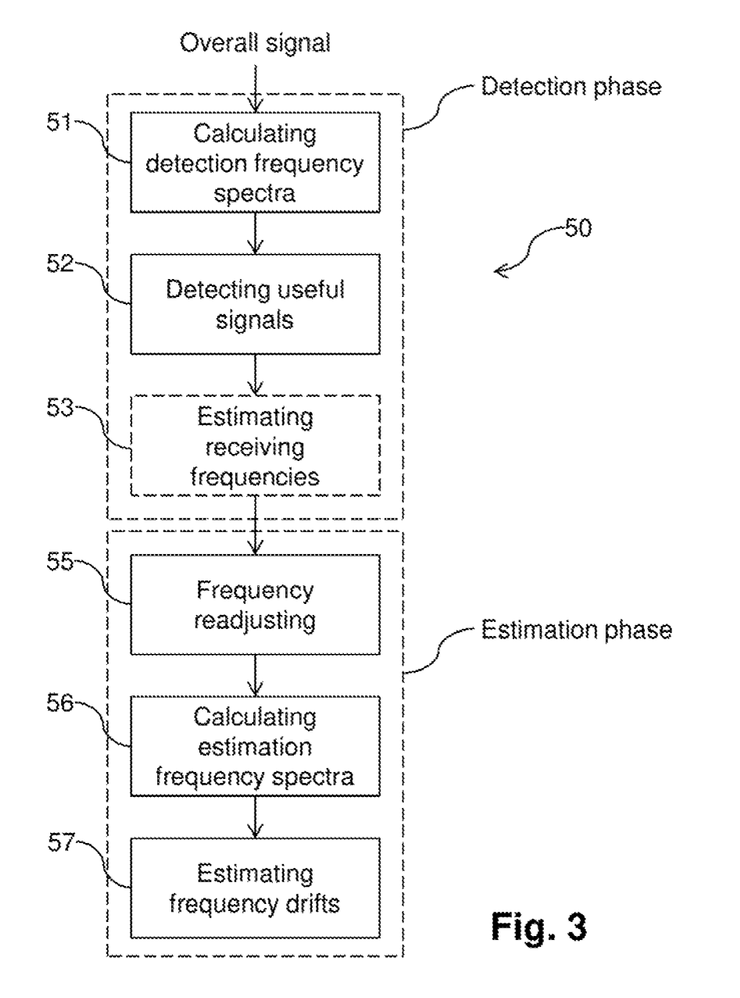
FIG. 3: a diagram showing the main steps of a first alternative embodiment of the detection method shown in FIG. 2, FIG. 4: a diagram showing the main steps of a second alternative embodiment of the detection method shown in FIG. 2, FIG. 5: a diagrammatic view of a sequential data processing architecture.

FIG. 3 shows the main steps of a specific embodiment of the detection method 50.

As shown in FIG. 3, the detection phase of the detection method 50 comprises, in addition to the steps described hereinabove with reference to FIG. 2, a step 53 of estimating a receiving frequency $F_m$ ($0 \leq m \leq N_P-1$) for each useful signal detected, as a function of the detection frequency spectra $SD_k$. The receiving frequency $F_m$ ($0 \leq m \leq N_P-1$) for said useful signal detected can, for example, be estimated to be the discrete frequency for which the local maximum, associated with said useful signal detected, has been obtained within the detection frequency spectrum $SD_k$ having led to the detection of this useful signal.

B) Estimation Phase

As stated hereinabove, the estimation phase comprises a plurality of steps which are carried out for each useful signal detected during the detection phase. In the description hereafter, these steps are described while considering only a single useful signal detected, it being understood that said steps are, in practice, carried out for each useful signal detected.

B.1) Readjusting the Frequency of the Overall Signal

As stated hereinabove, the estimation phase comprises a step 55 of readjusting the frequency of the overall signal for a plurality of frequency drift values.

The frequency of the overall signal is preferably readjusted mainly in an estimation time window positioned at the level of the useful signal detected, of a predetermined duration $\Delta T$ that is longer than the duration $OT$ of the detection time window. In the description hereinbelow, the case considered is that in which the estimation time window comprises $N_{EST}$ samples of the overall signal ($\Delta T = N_{EST} \cdot Te$). For example, the number $N_{EST}$ is equal to the number $N_{REF}$ of samples of the reference detection pattern.

The estimation time window is positioned, relative to the overall signal, such that it comprises at least a part of the useful signal detected, and in particular of the detection pattern of said useful signal detected. For example, the estimation time window starts at the estimated time of receipt $T_m$, and comprises the $N_{EST}$ samples $x[T_m]$ to $x[T_m+N_{EST}-1]$ of the overall signal, and where $xe_m$ denotes the vector comprising said $N_{EST}$ samples:

$$xe_m = \{xe_m[n] = x[T_m+n], 0 \leq n \leq N_{EST}-1\}$$

In this estimation time window at least, the overall signal is readjusted as a function of a plurality of frequency drift values, which correspond to possible values of the frequency drift affecting the useful signal detected.

The different frequency drift values to be considered are, for example, chosen such that they are evenly distributed over a predetermined range of possible values, the boundaries whereof are, for example, defined as a function of a priori knowledge of the maximum frequency drifts likely to affect the different useful signals (for example, as a function of the maximum travelling speeds of the terminals 10 and of the receiving station 20, as a function of the maximum frequency drift of the frequency synthesis means of the terminals 10, etc.). The range of possible values for the frequency drift can be predefined and unvarying over time. According to other examples, the range of possible values for the frequency drift can vary over time and be, for example, updated to take into account estimated frequency drifts for useful signals detected when previously carrying out the detection method 50.

The range of possible values comprises a number $N_{DER}$ of frequency drift values $\alpha_j$ ($0 \leq j \leq N_{DER}-1$). For example, the number $N_{DER}$ is equal to 11, and the frequency drift values $\alpha_j$ lie in the range −500 hertz per second (Hz/s) to 0 Hz/s, in 50 Hz/s increments:

$$\alpha_j \in \{-500, -450, \ldots, -50, 0\} \text{Hz/s}$$

The overall signal, the frequency whereof has been readjusted by the frequency drift value denoted by $r_j = \{r_j[n], 0 \leq j \leq N_{EST}-1\}$, is, for example, calculated according to the following formula:

$$r_j[n] = xe_m[n] \cdot e^{-j \pi \cdot \alpha_j \cdot (n \cdot Te)^2}$$

in which formula:

j is the imaginary unit ($j^2 = -1$), $e^{(z)}$ is the exponential function of the value z.

In the case wherein the receiving frequency $F_m$ of the useful signal detected was also estimated during the detection phase, the frequency of the overall signal is preferably readjusted also as a function of said estimated receiving frequency $F_m$, for example according to the following formula:

$$r_j[n] = xe_m[n] \cdot e^{-j \pi \cdot (\alpha_j \cdot (n \cdot Te)^2 + 2 \cdot F_m \cdot n \cdot Te)}$$

B.2) Calculating an Estimation Frequency Spectrum

The estimation phase comprises a step 56 of calculating an estimation frequency spectrum of the overall signal $r_j$ ($0 \leq j \leq N_{DER}-1$) for each considered frequency drift value over the estimation time window.

As stated hereinabove, the step 56 of calculating an estimation frequency spectrum preferably comprises a combination of the overall signal and the reference detection pattern positioned at the level of the estimation time window. The combination corresponds, for example, to a correlation of the overall signal $r_j$ with the reference detection pattern, in which case the overall signal $r'_j$ obtained after combination corresponds, for example, to the following vector:

$$r'_j = \{r_j[n] \cdot p_{REF}[n]^*, 0 \leq n \leq N_{EST}-1\}$$

The estimation frequency spectrum of the overall signal $r'_j$ obtained after combination over the estimation time window is denoted as $SE_j$. The estimation frequency spectrum $SE_j$ is, for example, calculated by an FFT of the overall signal $r'_j$, in which case:

$$SE_j = FFT(r'_j)$$

It should be noted that the combination can be calculated indifferently either in the time domain or in the frequency domain. In particular, said combination can be carried out in the time domain, before calculating the estimation frequency spectrum $SE_j$, or after passing into the frequency domain, by combining the frequency spectrum of the reference detection pattern and the estimation frequency spectrum $SE_j$.

Moreover, it should be noted that the frequency-readjusting step 55 can be carried out indifferently either before the step 56 of calculating the estimation frequency spectrum, or after said step 56 for calculating the estimation frequency spectrum, or even simultaneously therewith. It should also be noted that the readjusting of the frequency of the overall signal can be carried out indifferently either in the time domain or in the frequency domain.

Thus, at the end of the calculation step 56, $N_{DER}$ estimation frequency spectra $SE_j$ are obtained, for example, for each useful signal detected, and are respectively associated with the $N_{DER}$ different frequency drift values $\alpha_j$ being considered ($0 \le j \le N_{DER}-1$).

B.3) Estimating the Frequency Drift

As stated hereinabove, the estimation phase further comprises a step 57 of estimating the frequency drift affecting the useful signal detected as a function of the estimation frequency spectra $SE_j$ ($0 \le j \le N_{DER}-1$).

In preferred embodiments, the step 57 of estimating the frequency drift affecting the useful signal detected comprises searching for an overall maximum in all of the estimation frequency spectra $SE_j$ calculated for said useful signal detected. The frequency drift affecting said useful signal detected, denoted as $\delta F_m$ ($0 \le m \le N_P-1$), is, for example, estimated to be the frequency drift value $\alpha_j$ associated with the estimation frequency spectrum $SE_j$ comprising said overall maximum.

Preferably, the overall maximum is sought among the values of the estimation frequency spectra $SE_j$ ($0 \le j \le N_{EST}-1$) obtained in a frequency band of a predetermined bandwidth, which is less than the bandwidth of the multiplexing frequency band, about a theoretical receiving frequency for the useful signal detected. The theoretical receiving frequency for the useful signal detected corresponds, for example, to a priori knowledge of the receiving frequency of said useful signal detected, or even, in the case shown in FIG. 3, to the receiving frequency $F_m$ estimated during the detection phase (or a zero frequency if the frequency of the overall signal is readjusted as a function of the estimated receiving frequency $F_m$), etc. For useful narrowband signals, the frequency bandwidth of said frequency band, in which the overall maximum is sought, is, for example, about 30 Hz.

B.4) Estimating the Receiving Frequency of a Useful Signal Detected

Figure 4:
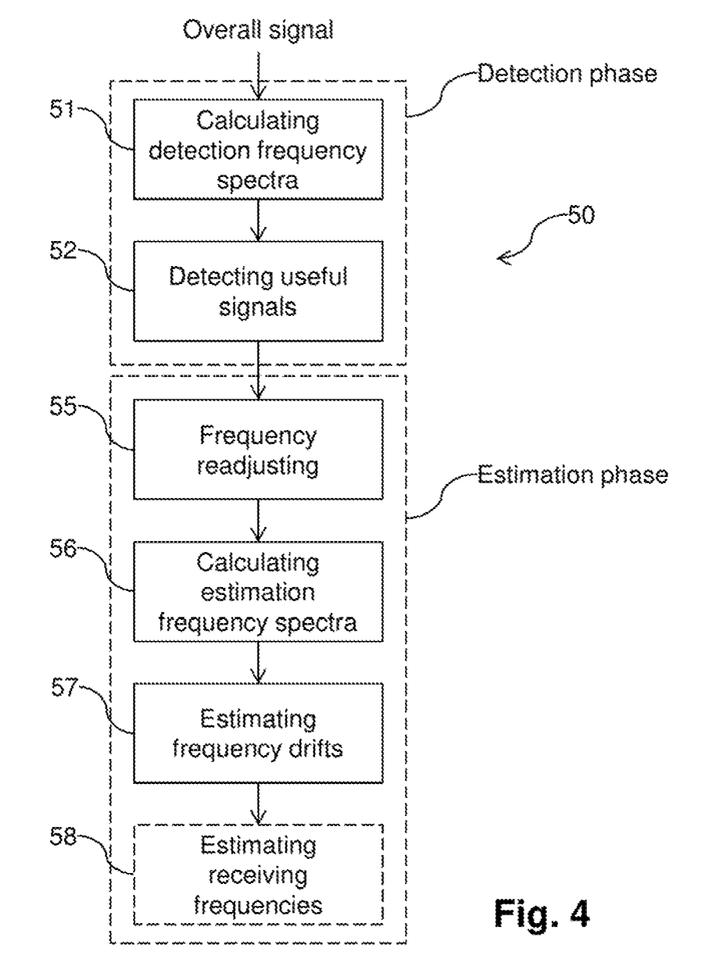

FIG. 4 shows the main steps of a specific embodiment of the detection method 50.

As shown in FIG. 4, the estimation phase of the detection method 50 comprises, in addition to the aforementioned steps provided with reference to FIG. 2, a step 58 of estimating the receiving frequency $F_m$ of the useful signal detected as a function of the estimation frequency spectra $SE_j$. More particularly, the receiving frequency $F_m$ ($0 \le m \le N_P-1$) for said useful signal detected can, for example, be estimated to be the discrete frequency for which the overall maximum, associated with said useful signal detected, has been obtained within the estimation frequency spectra $SE_j$.

In the case wherein the receiving frequency $F_m$ of the useful signal detected was estimated during the detection phase (step 53 in FIG. 3), the estimation step 58 consists of updating said estimation of the receiving frequency $F_m$. More specifically, because the estimation time window has a longer duration than that of the detection time window, or a much longer duration than the latter (at least by a factor of five), the frequency resolution, and thus the accuracy with which said receiving frequency can be estimated, is far better for the estimation frequency spectra $SE_j$ than for the detection frequency spectra $SD_k$.

C) Detection Module

The hardware architecture of the detection module 40 used to implement the detection method 50 is, in the preferred embodiments, optimized in order to minimize the duration of the calculations to be carried out.

Preferably, the detection module 40 implements the different steps of the detection method 50 in a massively parallel manner in order to optimize the use of the hardware resources available to the detection module 40. Such an approach makes it possible to either reduce the price of the detection module 40 by reducing the size thereof compared to a conventional solution, or to increase the processing capacity thereof.

Figure 5:
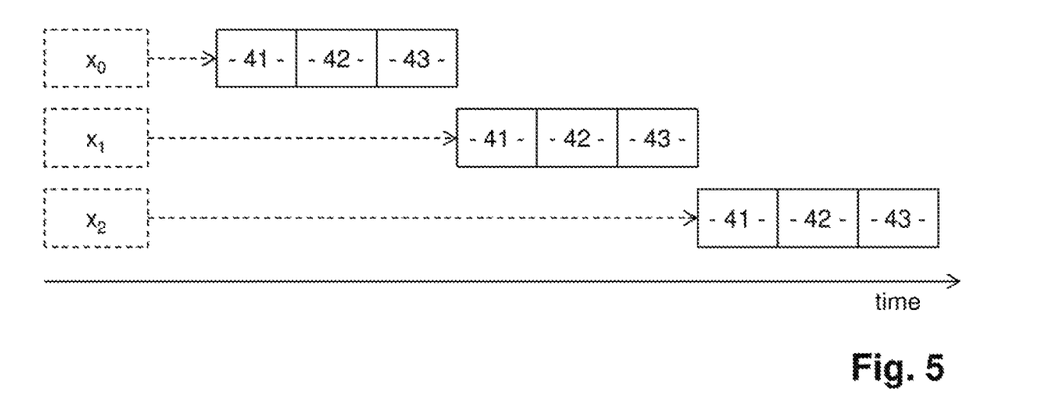

FIG. 5 diagrammatically shows a sequential processing architecture of the vectors $x_k$ ($0 \le k \le N_{FEN}-1$) of samples of the overall signal, associated with the $N_{FEN}$ positions of the detection time window. In the example shown in FIG. 5, $N_{FEN}$ is taken in a non-limiting manner to be equal to 3. The processing operations applied to these vectors $x_k$ show a sequential processing architecture wherein successive processing operations are applied to each vector; which operations carry out the steps of the detection method 50. These processing operations will monopolies different arithmetic units 41, 42, 43 of the detection module 40. Each arithmetic unit 41, 42, 43 carries out a given function (for example an FFT, a correlator, etc.) by using hardware resources of the detection module 40. Such a sequential processing architecture is not very efficient since it underuses the arithmetic units 41, 42, 43.

Figure 6:
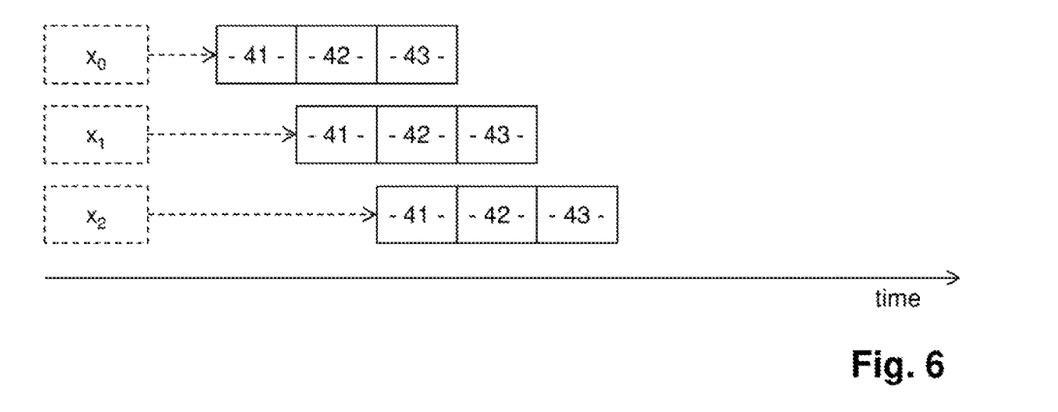
FIG. 6: a diagrammatic view of a pipeline data processing architecture.

FIG. 6 shows a pipeline processing architecture, as preferably used in the invention since it improves the use of the arithmetic units 41, 42, 43. With this pipeline processing architecture, the different vectors $x_k$ are processed in parallel by the detection module 40. In this example, the arithmetic unit 41 operates at 100% of the capacity thereof in the pipeline processing architecture (FIG. 6), whereas it operates at only 33% of the capacity thereof in the sequential processing architecture (FIG. 5).

In practice, the calculation time for each step can be different since each step can require a different amount of calculations. In order to optimize the pipeline processing architecture, the non-dependence property of the data between each step is generally exploited in order to make the arithmetic units of the more complex steps parallel.

Figure 7:
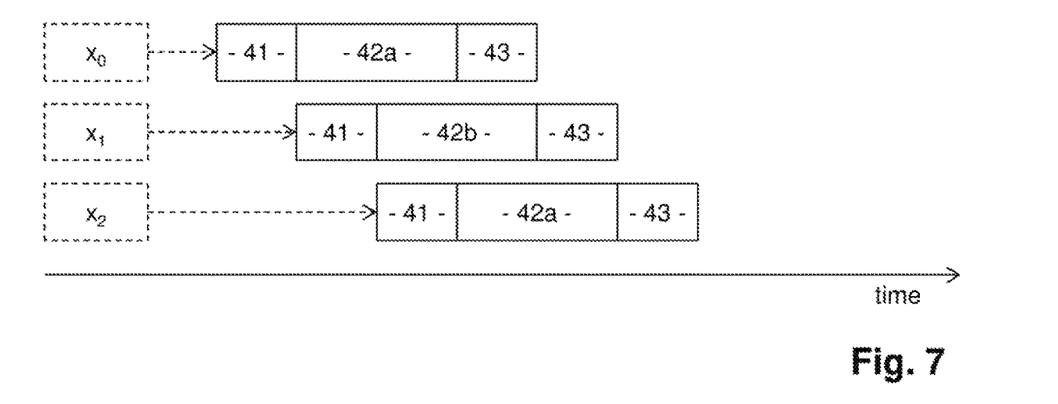
FIG. 7: a diagrammatic view of an alternative embodiment of the pipeline processing architecture shown in FIG. 6, FIG. 8: a diagrammatic view of a pipeline processing architecture for the different phases of the detection method shown in FIG. 2.

With reference to FIG. 7, in such a case, the second data processing step would, for example, be carried out by two arithmetic units 42a and 42b in the following manner: the vectors $x_0$ and $x_2$ would, for example, use the arithmetic unit 42a for this second step of the method since they are performed out of step with one another in time, whereas the vector $x_1$ would, for example use the arithmetic unit 42b since this operation overlaps with the use of the arithmetic unit 42a for processing the vector $x_0$. This allows the highest flow rates to be absorbed at the output of the arithmetic unit 41. This principle is generalized for the whole pipeline processing architecture for all steps.

The detection method 50 allows the critical calculation steps to be effectively carried out in parallel, in order to obtain an optimized pipeline processing architecture, since:

for the detection phase, the data flows (inputs/outputs) and the calculations of the different steps (step 51 of calculating detection frequency spectra, step 52 of detecting useful signals, etc.) are independent for each considered time position of the detection time window, for the estimation phase, the data flows (inputs/outputs) and the calculations of the different steps (step 55 of frequency readjusting, step 56 of calculating estimation frequency spectra, step 57 of estimating frequency drifts, etc.) are independent for each useful signal detected.

Figure 8:
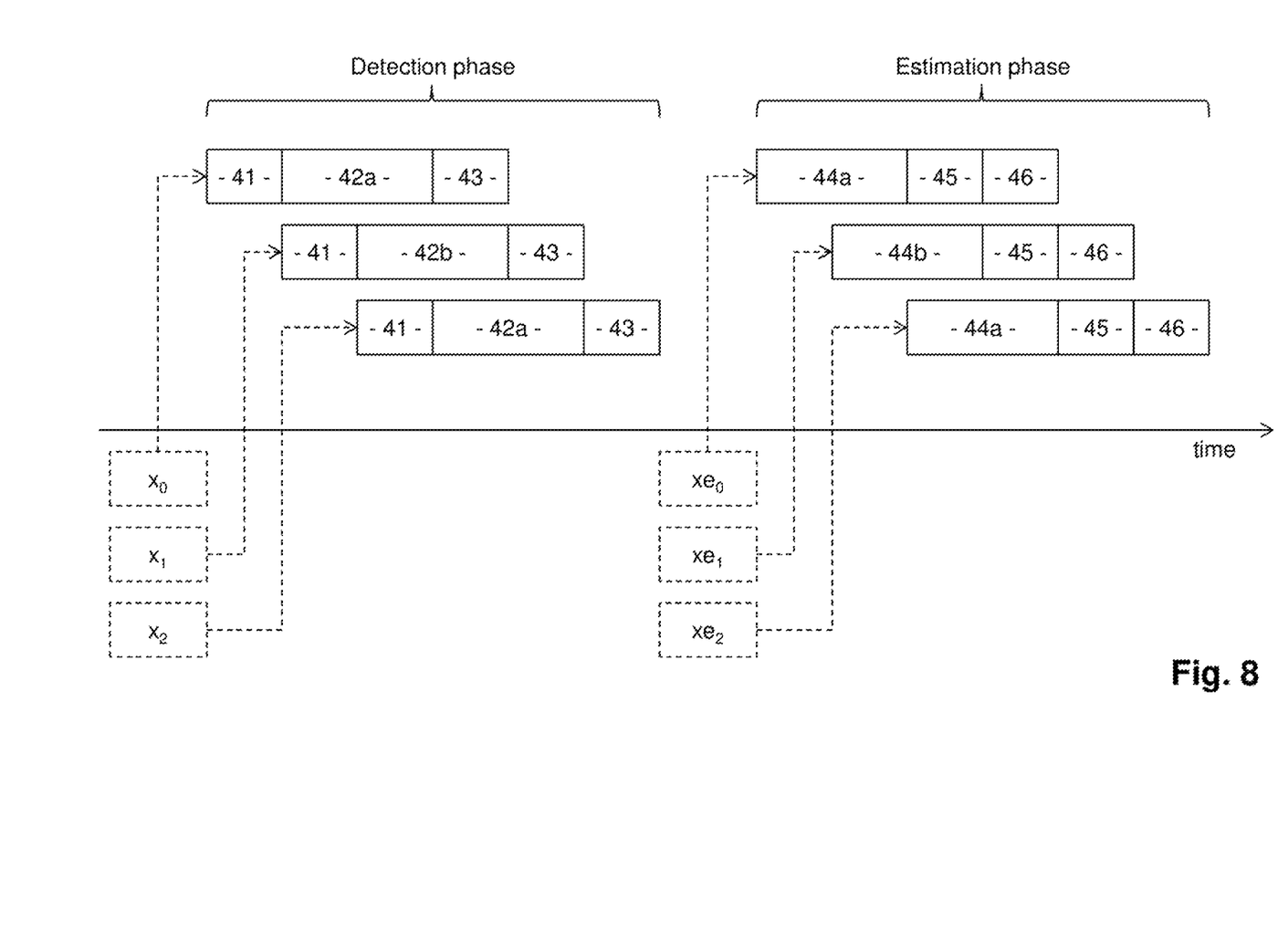

FIG. 8 diagrammatically shows the pipeline processing architecture used to implement the detection method 50. The two major phases of the detection method 50 are encountered, that is to say the detection phase and the estimation phase, each whereof being represented by processing groups being carried out successively over time. More specifically, the estimation phase is only performed on the $N_P$ useful signals detected. In the example shown in FIG. 8, $N_P$ is taken in a non-limiting manner to be equal to 3.

FIG. 8 clearly shows the fact that, for each detection phase, a pipeline processing architecture is used to carry out, in parallel, the different processing operations performed by the arithmetic units 41, 42a, 42b and 43, for each of the considered time positions for the detection time window. The same is true for each estimation phase that uses a pipeline processing architecture to carry out, in parallel, the different processing operations performed by arithmetic units 44a, 44b, 45 and 46, for each useful signal detected.

The operating principle of parallelism of the detection method 50 can also be applied in order to carry out the detection and estimation phases in parallel on different datasets, for example corresponding to overall signals originating from different frequency bands.

Thus, the structure of the detection method 50 allows for the implementation of a massively parallel processing architecture in the detection module 40 in order to maximize reuse of the hardware resources.

The different degrees of parallelism previously present can be exploited to make the best possible compromise with regard to the design of the detection module 40 (size, consumption, operating speed). This efficient operation is made possible because the time and frequency dimensions are processed independently, thus facilitating a pipeline processing architecture for exploiting parallelism by converting a 2-dimensional problem into two 1-dimensional problems.

Moreover, in order to satisfy different contexts of use, as a function of the range/resolution according to the time dimension (detection phase) and the range/resolution according to the frequency dimension (estimation phase), the scalability of the architecture is also simple to implement because the degrees of parallelism are directly dependent on the number $N_{FEN}$ of time positions being considered and on the number $N_P$ of useful signals to be detected.

Finally, without becoming less generalized, the processing operations can be applied either all within the same processor of the detection module 40, or distributed over a plurality of processors of said detection module 40, as a function of the performance requirements imposed by the detection system.

The invention claimed is:

1. A method for detecting useful signals in an overall signal, the useful signals being emitted by different terminals in a multiplexing frequency band, each useful signal can be affected by a frequency drift, the overall signal corresponding to radio-frequency signals received in the multiplexing frequency band, wherein the method comprises:
   a detection phase comprising:
      for a plurality of positions of a detection time window relative to the overall signal: calculating a detection frequency spectrum of the overall signal for each detection time window being considered;
      detecting the useful signals in the overall signal as a function of the detection frequency spectra; and
   an estimation phase comprising, for each useful signal detected:
      for a plurality of frequency drift values: readjusting a frequency of the overall signal as a function of the frequency drift value being considered;
      calculating an estimation frequency spectrum of the overall signal for each frequency drift value over an estimation time window comprising at least part of the useful signal detected, and of a duration that is longer than that of the detection time window;
      estimating the frequency drift affecting the useful signal detected as a function of the estimation frequency spectra.

2. The method according to claim 1, wherein each useful signal comprising a detection pattern:
   the calculation of the detection frequency spectrum comprises, for said each detection time window, a combination of the overall signal and a reference detection pattern positioned at a level of said each detection time window considered;
   the calculation of the estimation frequency spectrum comprises, for each frequency drift value, a combination of the overall signal and the reference detection pattern positioned at a level of the estimation time window.

3. The method according to claim 2, wherein the combination of the overall signal and the reference detection pattern comprises a correlation of the overall signal with the reference detection pattern.

4. The method according to claim 1, wherein the duration of the detection time window is shorter than the duration of the reference detection pattern.

5. The method according to claim 1, further comprising:
   during the detection phase: estimating a receiving frequency for said each useful signal detected in the multiplexing band, as a function of the detection frequency spectra; and
   during the estimation phase, for said each useful signal detected: readjusting the frequency of the overall signal also as a function of the estimated receiving frequency for said each useful signal detected.

6. The method according to claim 1, further comprising, during the estimation phase, estimating a receiving frequency for said each useful signal detected in the multiplexing band, as a function of the estimation frequency spectra.

7. The method according to claim 1, wherein the detection of the useful signals comprises searching for local maxima in the detection frequency spectra, wherein a useful signal is considered to have been detected for a local maximum if the local maximum satisfies a predetermined detection criterion.

8. The method according to claim 1, wherein the estimation of the frequency drift affecting one of the useful signals detected comprises searching for an overall maximum in the estimated frequency spectra calculated for said each useful signal detected.

9. The method according to claim 8, wherein, during the estimation of the frequency drift, the overall maximum is sought from among the values of the estimation frequency spectra obtained in a frequency band of a predetermined bandwidth about a theoretical receiving frequency for a useful signal detected being considered.

10. The method according to claim 1, further comprising estimating a number of the useful signals to be detected in the overall signal, and wherein the detection of the useful signals is carried out as a function of the estimated number of the useful signals to be detected.

11. The method according to claim 1, further comprising estimating a range of possible values for the frequency drift, wherein the frequency drift values considered during the estimation phase lie in said range of possible values.

12. A computer program product recorded on a non-transitory media, comprising a set of program code instructions executable by a processor to perform the method for detecting useful signals in the overall signal according to claim 1.

13. A module for detecting useful signals in an overall signal, comprising a processing circuit configured to perform the method according to claim 1.

14. The module according to claim 13, further comprising a pipeline-type processing architecture.

15. The module according to claim 14, further comprising a first set of arithmetic units used solely for the detection phase and a second set of arithmetic units used solely for the estimation phase.

16. A system to detect the useful signals in the overall signal, comprising the detection module according to claim 13 and an antenna to receive the overall signal on board a spacecraft or aircraft.

17. The system according to claim 16, wherein the detection module is on board the spacecraft or aircraft.

* * * * *